(12) United States Patent
Chen et al.

(10) Patent No.: US 7,697,371 B2
(45) Date of Patent: Apr. 13, 2010

(54) CIRCUIT AND METHOD FOR CALIBRATING DATA CONTROL SIGNAL

(75) Inventors: Yi Lin Chen, Taipei (TW); Cheng Hsin Chang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 173 days.

(21) Appl. No.: 11/948,745

(22) Filed: Nov. 30, 2007

(65) Prior Publication Data
US 2008/0130377 A1  Jun. 5, 2008

(30) Foreign Application Priority Data
Dec. 1, 2006 (TW) .............................. 95144636 A

(51) Int. Cl.
*G11C 8/18* (2006.01)
(52) U.S. Cl. .................... 365/233.5; 365/193; 365/194; 365/233.1; 365/233.11; 365/233.13; 713/503
(58) Field of Classification Search ......... 365/191–194, 365/233.1–233.5; 713/500, 503
See application file for complete search history.

(56) References Cited

U.S. PATENT DOCUMENTS

| | | | |
|---|---|---|---|
| 6,753,701 B2 * | 6/2004 | Chang | 326/93 |
| 6,885,959 B2 | 4/2005 | Salmon et al. | |
| 6,898,724 B2 * | 5/2005 | Chang | 713/500 |
| 6,947,334 B2 | 9/2005 | Shin | |
| 7,295,044 B2 * | 11/2007 | Bucossi et al. | 327/65 |
| 2005/0057281 A1 | 3/2005 | Yoo | |
| 2006/0116839 A1 * | 6/2006 | Zumkehr et al. | 702/106 |
| 2007/0195615 A1 * | 8/2007 | Chen | 365/193 |

FOREIGN PATENT DOCUMENTS

TW         I255465         5/2006

* cited by examiner

*Primary Examiner*—Tuan T Nguyen
*Assistant Examiner*—R Lance Reidlinger
(74) *Attorney, Agent, or Firm*—Thomas, Kayden, Horstemeyer & Risley

(57) ABSTRACT

A circuit for calibrating a data control signal includes a time-delay compensation circuit and a voltage-control delay circuit. The time-delay compensation circuit receives two complementary signals and a direct current voltage which has two voltage cross points with the two complementary signals respectively, and outputs a control voltage according to a time difference between the two voltage cross points. The voltage-control delay circuit delays a data control signal for a predetermined time according to the control voltage, thereby eliminating signal skew between the data control signal and a data signal.

24 Claims, 5 Drawing Sheets

CIRCUIT AND METHOD FOR CALIBRATING DATA CONTROL SIGNAL

CROSS REFERENCE TO RELATED APPLICATION

This application claims the priority benefit of Taiwan Patent Application Serial Number 095144636, filed on Dec. 1, 2006, the full disclosure of which is incorporated herein by reference.

BACKGROUND OF THE INVENTION

1. Field of the Invention

This invention generally relates to a circuit and a method for calibrating a data control signal, and more particularly, to a circuit and a method for calibrating a data control signal of a DRAM memory.

2. Description of the Related Art

FIG. 1 shows a schematic view of a conventional memory controller 10 coupled to a double data rate (DDR) memory 12. The memory controller 10 utilizes a bi-directional data strobe signal DQS to write a data signal DQ into the DDR memory 12 or read the data signal DQ from the DDR memory 12. During writing operations, the memory controller 10 transmits the data strobe signal DQS and the data signal DQ to the DDR memory 12. In addition, during reading operations, the DDR memory 12 transmits the data strobe signal DQS and the data signal DQ to the memory controller 10.

According to DDR memory standard, the memory controller 10 and the DDR memory 12 sample data contained in the data signal DQ by each rising edge and each falling edge of the data strobe signal DQS. Therefore, it is relatively significant for the validity of the sampled data that the data strobe signal DQS is matched with the data signal DQ.

In the memory controller 10 or the DDR memory 12, the data strobe signal DQS can be outputted by an output driving circuit 14 as shown in FIG. 2. The output driving circuit 14 has at least one PMOS transistor 14a, one NMOS transistor 14b and an output terminal 15 for outputting the data strobe signal DQS. When the PMOS transistor 14a and the NMOS transistor 14b have the same driving ability, the output terminal 15 will output a data strobe signal DQS, as shown in FIG. 3, of which the rising time tr and the falling time tf are equal. However, due to the differences resulting from the manufacturing processes for the PMOS transistor 14a and the NMOS transistor 14b, they generally have different driving abilities such that the rising time tr and the falling time tf of the data strobe signal DQS are unequal. For example, if the driving ability of the PMOS transistor 14a is weaker than that of the NMOS transistor 14b, the rising time tr will be longer than the falling time tf. On the contrary, if the driving ability of the PMOS transistor 14a is stronger than that of the NMOS transistor 14b, the rising time tr will be shorter than the falling time tf.

Similarly, since the data signal DQ is also outputted by an output driving circuit, which is the same with the output driving circuit 14 shown in FIG. 2, the rising time and the falling time of the data signal DQ are also unequal.

In general, when the PMOS transistor and the NMOS transistor do not match (i.e. having different driving abilities), the skew between the data strobe signal DQS and the data signal DQ (i.e. DQ-DQS skew) is the smallest if both transition edges of the data strobe signal DQS and the data signal DQ are rising edges or falling edges at the same time. On the contrary, the skew between the data strobe signal DQS and the data signal DQ (i.e. DQ-DQS skew) is the largest if the transition edge of the data strobe signal DQS is opposite to the transition edge of the data signal DQ at the same time, meaning that one is a rising edge while the other is a falling edge. Taking FIG. 4 for example, if the PMOS transistor and the NMOS transistor do not match with each other to cause the rising time to be shorter than the falling time in the data strobe signal DQS and the data signal DQ, the DQ-DQS skew is the smallest during the time interval from t1 to t2 and the largest during the time interval from t3 to t4. Therefore, the DQ-DQS skew during the time interval from t3 to t4 will limit the valid time interval for sampling the required data.

SUMMARY OF THE INVENTION

It is an object of the present invention to provide a circuit and a method for calibrating a data control signal, thereby decreasing signal skew between a data strobe signal and a data signal so as to overcome the problem of limiting the valid time for sampling the required data.

In order to achieve the above object, the present invention provides a calibrating circuit for a data control signal comprising a time-delay compensation circuit and a voltage-control delay circuit; wherein the time-delay compensation circuit receives two complementary signals and a direct current voltage having two voltage cross points with the two complementary signals. The time-delay compensation circuit outputs a control voltage according to a time difference between the two voltage cross points; and the voltage-control delay circuit receives the data control signal and delays the data control signal for a predetermined time according to the control voltage, thereby decreasing signal skew between the data control signal and a data signal.

The present invention also provides a method for real-time calibrating data control signal and data signal for calibrating a data control signal of a DRAM memory. The method provides a first signal, a second signal complementary to the first signal, and a direct current voltage having a first voltage cross point with the first signal and a second voltage cross point with the second signal. The method delays the data control signal for a predetermined time according to a time difference between the first and second voltage cross points.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE EMBODIMENT

Figure 5:
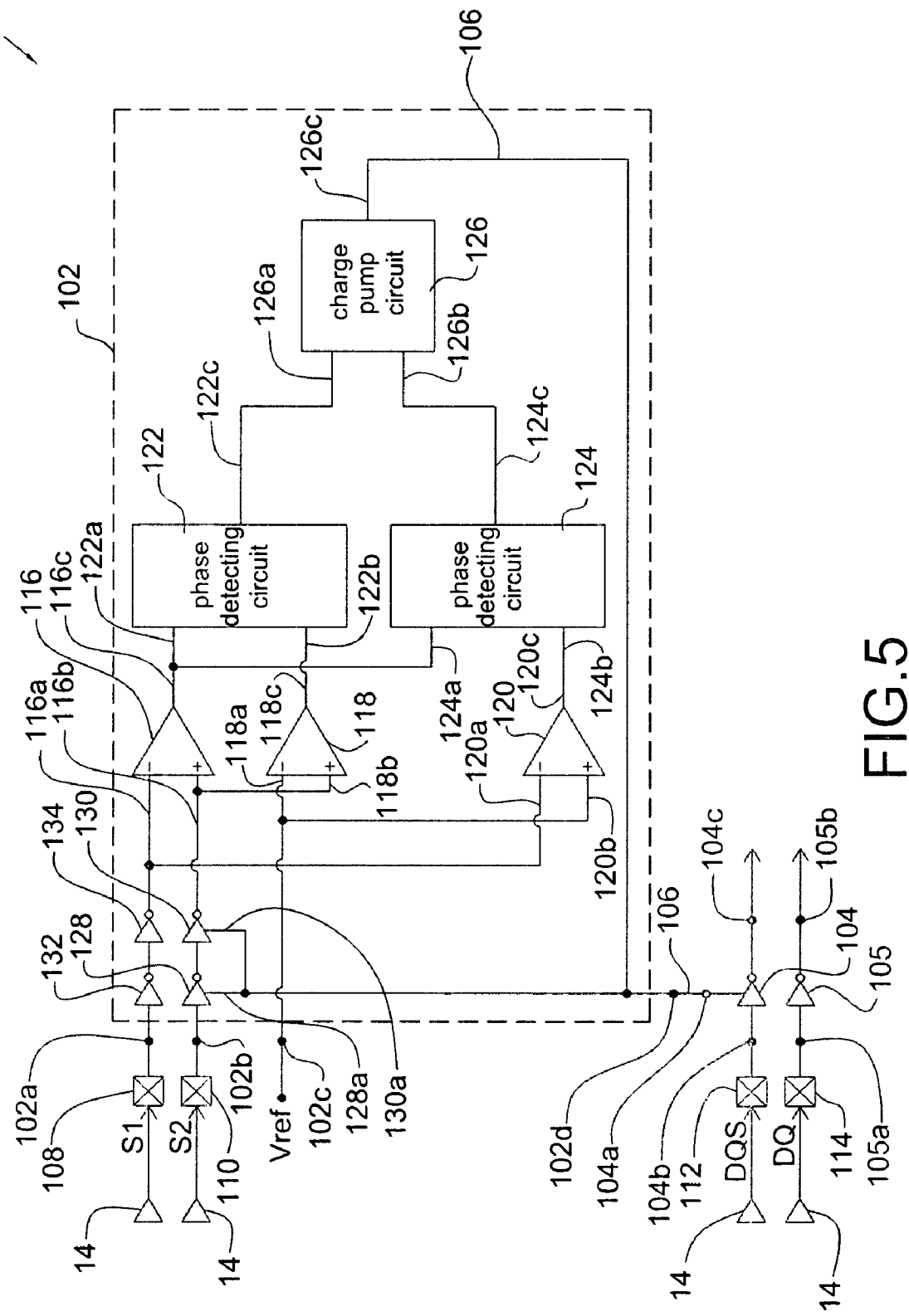
FIG. 5 shows a schematic view of a calibrating circuit according to one embodiment of the present invention.

FIG. 5 shows a schematic view of a calibrating circuit 100 for a data control signal according to one embodiment of the present invention. The calibrating circuit 100 can be disposed within a DDR memory controller (not shown) or a DDR memory (not shown), and has a time-delay compensation circuit 102, a voltage-control delay circuit 104 and a delay circuit 105. The time-delay compensation circuit 102 receives two complementary signals S1 and S2 respectively through two inputs 102a and 102b, and receives a direct current (dc) reference voltage Vref through an input 102c. The time-delay compensation circuit 102 further has an output 102d for outputting a control voltage 106 to the voltage-control delay circuit 104. The voltage-control delay circuit 104 has a control terminal 104a for receiving the control voltage 106, an input 104b for receiving a data strobe signal DQS, and an output 104c for outputting the data strobe signal DQS. The voltage-control delay circuit 104 has an adjustable delay time wherein the delay time is adjusted according to the control voltage 106. The delay circuit 105 has an input 105a for receiving a data signal DQ, and an output 105b for outputting the data signal DQ. The delay circuit 105 has a constant delay time.

When the calibrating circuit 100 is disposed within a DDR memory, the two complementary signals S1 and S2, the data strobe signal DQS and the data signal DQ are outputted through output driving circuits 14 formed within a DDR memory controller and enter the DDR memory through the input pads 108, 110, 112 and 114, respectively. On the contrary, when the calibrating circuit 100 is disposed within a DDR memory controller, the two complementary signals S1 and S2, the data strobe signal DQS and the data signal DQ are outputted through output driving circuits 14 formed within a DDR memory and enter the DDR memory controller through the input pads 108, 110, 112 and 114, respectively.

The time-delay compensation circuit 102 includes three comparators, i.e. a first comparator 116, a second comparator 118 and a third comparator 120, two phase detecting circuits, i.e. a first phase detecting circuit 122 and a second phase detecting circuit 124, a charge pump circuit 126, two voltage-control delay circuits 128 and 130, and two delay circuits 132 and 134. In this embodiment, the comparators 116, 118 and 120 can be implemented by operational amplifiers.

The first comparator 116 has an inverting input 116a electrically connected to an output of the delay circuit 134, a non-inverting input 116b electrically connected to an output of the voltage-control delay circuit 130, and an output 116c electrically connected to an input 122a of the first phase detecting circuit 122 and an input 124a of the second phase detecting circuit 124. The second comparator 118 has an inverting input 118a electrically connected to the dc reference voltage Vref, a non-inverting input 118b electrically connected to the non-inverting input 116b of the first comparator 116, and an output 118c electrically connected to the other input 122b of the first phase detecting circuit 122. The third comparator 120 has an inverting input 120a electrically connected to the inverting input 116a of the first comparator 116, a non-inverting input 120b electrically connected to the dc reference voltage Vref, and an output 120c electrically connected to the other input 124b of the second phase detecting circuit 124.

The first phase detecting circuit 122 has the two inputs 122a, 122b and an output 122c electrically connected to an input 126a of the charge pump circuit 126. The second phase detecting circuit 124 has the two inputs 124a, 124b and an output 124c electrically connected to the other input 126b of the charge pump circuit 126. The charge pump circuit 126 has the two inputs 126a, 126b and an output 126c respectively electrically connected to the control terminals 104a, 128a and 130a of the voltage-control delay circuits 104, 128 and 130. The voltage-control delay circuit 128 is connected to the voltage-control delay circuit 130 in series and receives the signal S2 through its input. Each of the voltage-control delay circuits 128 and 130 has an adjustable delay time, wherein the delay time is adjusted according to the control voltage 106. In this embodiment, the voltage-control delay circuits 128 and 130 can be implemented by a voltage control delay line (VCDL). The delay circuits 132 and 134 are connected together in series and respectively have a constant delay time, wherein the input of the delay circuit 132 receives the signal S1.

Figure 1:
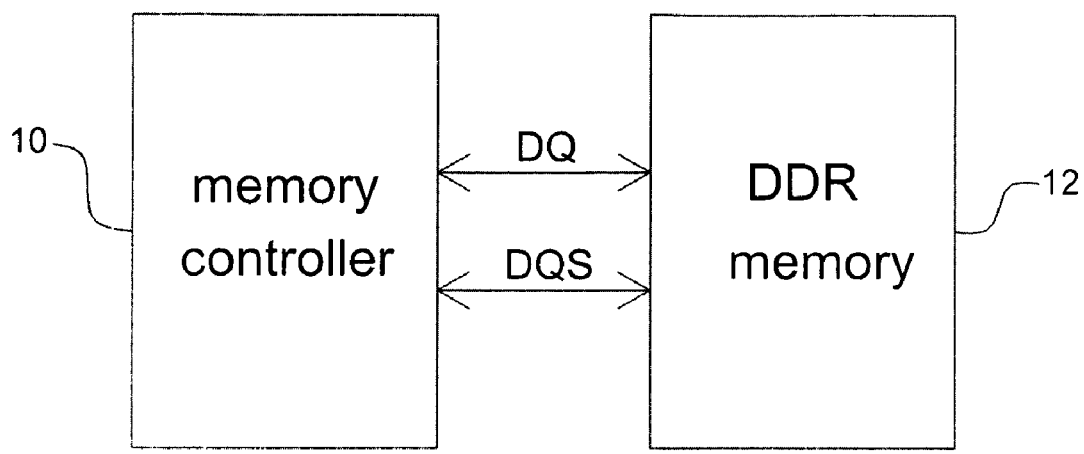
FIG. 1 shows a schematic view of a conventional memory controller coupled to a double data rate (DDR) memory.
Figure 2:
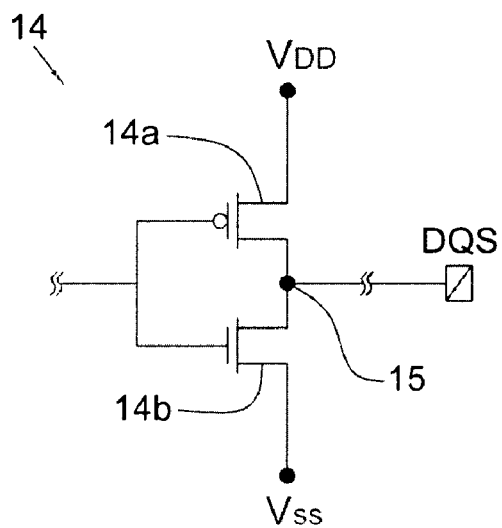
FIG. 2 shows a schematic view of a conventional output driving circuit.
Figure 3:
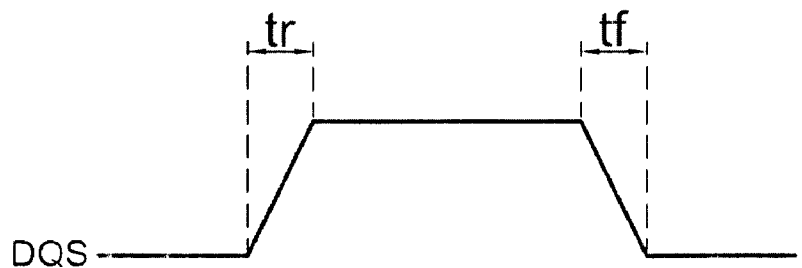
FIG. 3 shows a waveform of a data strobe signal DQS.
Figure 4:
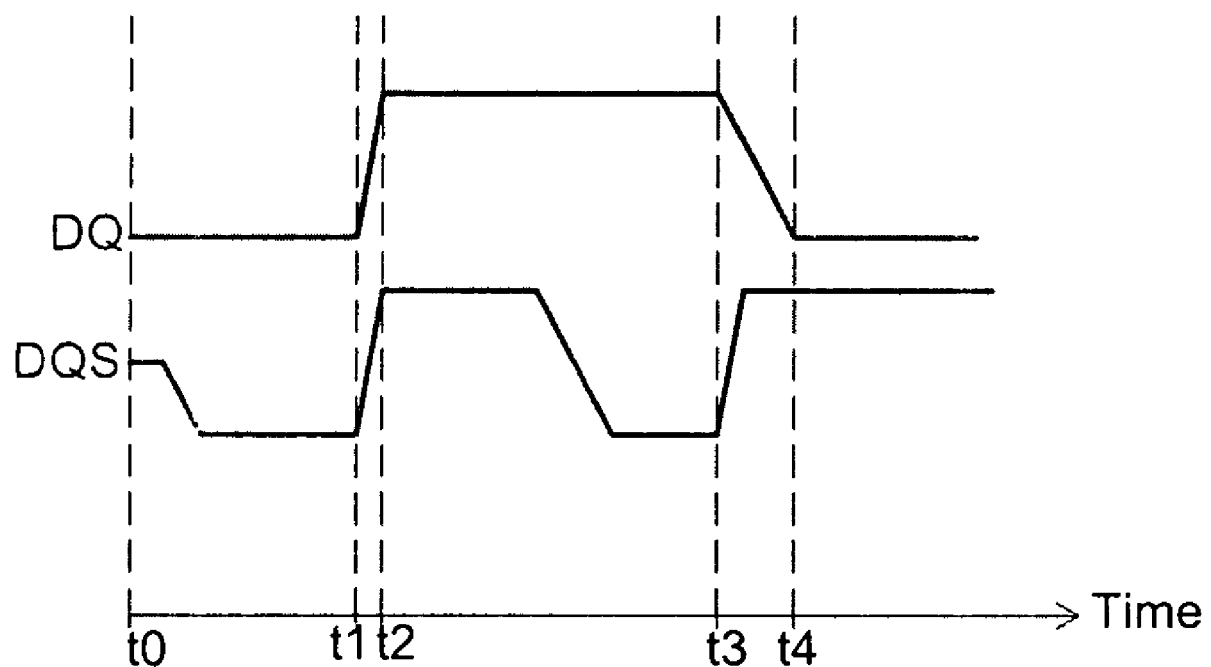
FIG. 4 shows a timing diagram of a data strobe signal DQS and a data signal DQ.
Figure 6:
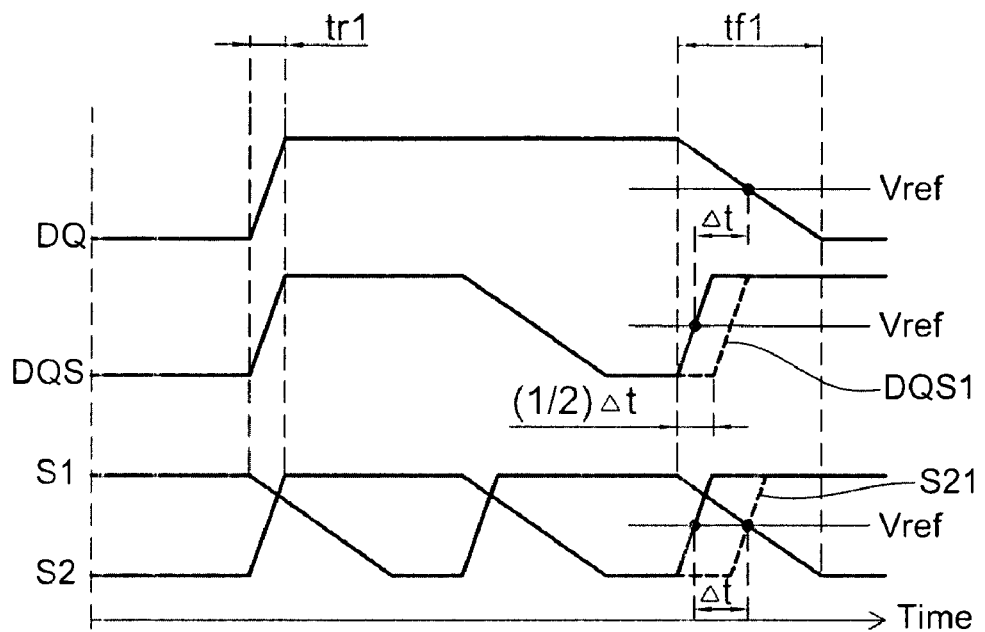
FIG. 6 shows a timing diagram of the signals S1, S2, DQS, DQ in the calibrating circuit shown in FIG. 5.

In this embodiment, each output driving circuit 14 consists of a PMOS transistor and a NMOS transistor as shown in FIG. 2. The PMOS transistors and NMOS transistors are respectively formed by the same processes; therefore, the rising edges of their outputted signals S1, S2, DQS and DQ have the same driving performance according to the driving ability of the PMOS transistor, and the falling edges of these signals have the same driving performance according to the driving ability of the NMOS transistor. For clearly illustrating the operation of the calibrating circuit 100, it is assumed that the driving ability of the PMOS transistor is stronger than that of the NMOS transistor in each output driving circuit 14, and the outputted signals S1, S2, DQS and DQ are shown in FIG. 6. In this embodiment, since the driving ability of the PMOS transistor is stronger than that of the NMOS transistor in each output driving circuit 14, each rising time tr1 is shorter than each falling time tf1 in the signals S1, S2, DQS and DQ. In addition, when the rising edge tr1 of the data strobe signal DQS and the falling edge tf1 of the data signal DQ occur at the same time, the skew between the data strobe signal DQS and the data signal DQ (i.e. DQ-DQS skew) is the largest. The operation of the calibrating circuit 100 and the calibrating method according to the present invention will be described below.

Figure 7:
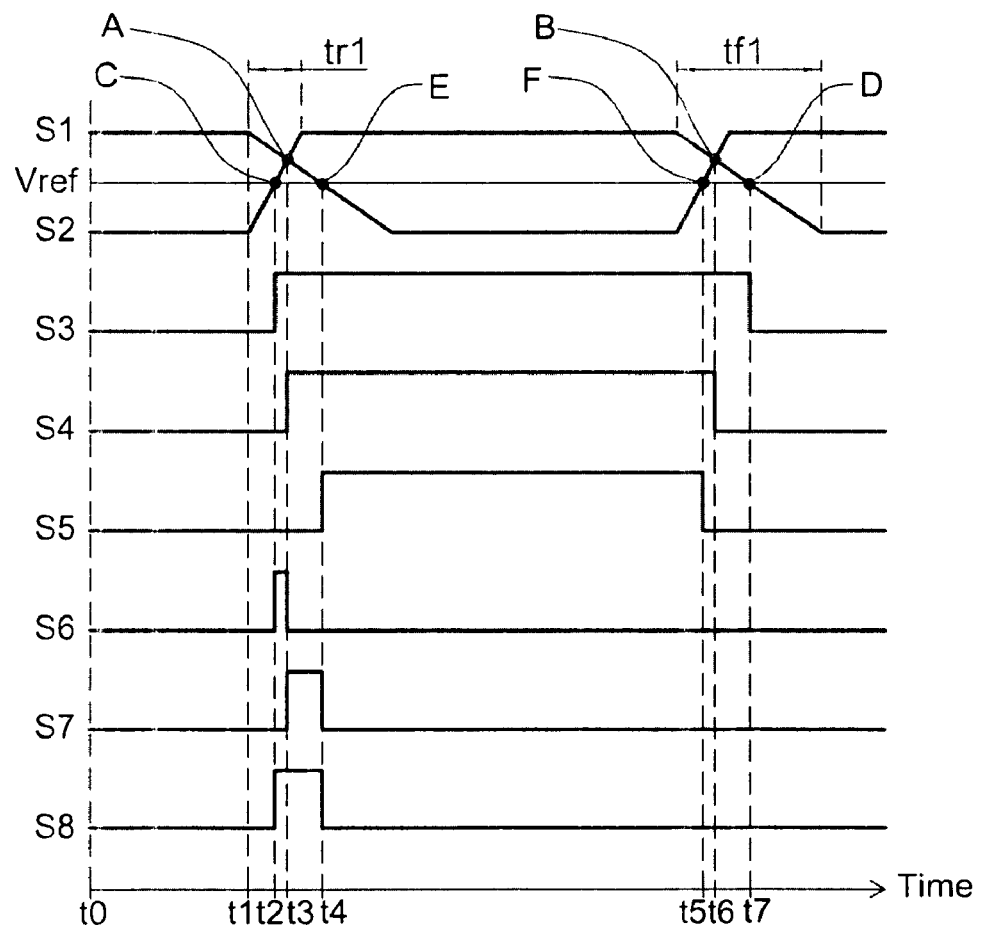
FIG. 7 shows a timing diagram of the signals S1, S2, S3, S4, S5, S6, S7 and S8 in the calibrating circuit shown in FIG. 5.

First, the first comparator 116 receives the signal S1 through the input 116a and receives the signal S2 through the other input 116b. After the first comparator 116 receives the signals S1 and S2, the first comparator 116 outputs a comparison signal S4, as shown in FIG. 7, through the output 116c according to the voltage levels of the signals S1 and S2. The comparison signal S4 is presented as a low voltage level, e.g. during time interval from t0 to t3, while the voltage level of the signal S1 is larger than that of the signal S2; and presented as a high voltage level, e.g. during time interval from t3 to t6, while the voltage level of the signal S1 is smaller than that of the signal S2. At time t3, the falling edge of the signal S1 has a voltage cross point A with the rising edge of the signal S2, and the comparison signal S4 converts from the low voltage level to the high voltage level at the time that the voltage cross point A occurs. At time t6, the rising edge of the signal S1 has a voltage cross point B with the falling edge of the signal S2, and the comparison signal S4 transits from the high voltage level to the low voltage level at the time that the voltage cross point B occurs.

The second comparator 118 receives the dc reference voltage Vref through the input 118a and receives the signal S2 through the other input 118b. The voltage level of the dc reference voltage Vref is positioned between the high voltage level and the low voltage level of the signals S1/S2, and preferably positioned at a middle level between the high voltage level and the low voltage level as shown in FIG. 7. After the second comparator 118 receives the dc reference voltage Vref and the signal S2, the second comparator 118 outputs a comparison signal S3, as shown in FIG. 7, through the output 118c according to the voltage levels of the dc reference voltage Vref and the signal S2. The comparison signal S3 is presented as a low voltage level, e.g. during time interval from t0 to t2, while the voltage level of the dc reference voltage Vref is larger than that of the signal S2; and presented as a high voltage level, e.g. during time interval from t2 to t7, while the voltage level of the dc reference voltage Vref is smaller than that of the signal S2. At time t2, the dc reference voltage Vref has a voltage cross point C with the rising edge of the signal S2, and the comparison signal S3 transits from the low voltage level to the high voltage level at the time that the voltage cross point C occurs. At time t7, the dc reference voltage Vref has a voltage cross point D with the falling edge of the signal S2, and the comparison signal S3 transits from the high voltage level to the low voltage level at the time that the voltage cross point D occurs.

The third comparator 120 receives the signal S1 through the input 120a and receives the dc reference voltage Vref through the other input 120b. After the third comparator 120 receives the signal S1 and the dc reference voltage Vref, it outputs a comparison signal S5, as shown in FIG. 7, through the output 120c according to the voltage levels of the signal S1 and the dc reference voltage Vref. The comparison signal S5 is presented as a low voltage level, e.g. during time interval from t0 to t4, while the voltage level of the signal S1 is larger than that of the dc reference voltage Vref; and presented as a high voltage level, e.g. during time interval from t4 to t5, while the voltage level of the signal S1 is smaller than that of the dc reference voltage Vref. At time t4, the falling edge of the signal S1 has a voltage cross point E with the dc reference voltage Vref, and the comparison signal S5 transits from the low voltage level to the high voltage level at the time that the voltage cross point E occurs. At time t5, the rising edge of the signal S1 has a voltage cross point F with the dc reference voltage Vref, and the comparison signal S5 transits from the high voltage level to the low voltage level at the time that the voltage cross point F occurs.

Afterwards, the first phase detecting circuit 122 receives the comparison signals S4 and S3 respectively through the inputs 122a and 122b, and then outputs a phase difference signal S6 to the input 126a of the charge pump circuit 126 according to the phase difference between the signals S4 and S3. The pulse width of the phase difference signal S6 represents the time difference between the voltage cross point A and the voltage cross point C, i.e. the difference between time t3 and time t2. In addition, the second phase detecting circuit 124 receives the comparison signals S4 and S5 respectively through the inputs 124a and 124b, and then outputs a phase difference signal S7 to the input 126b of the charge pump circuit 126 according to the phase difference between the signals S4 and S5. The pulse width of the phase difference signal S7 represents the time difference between the voltage cross point F and the voltage cross point A, i.e. the difference between time t4 and time t3.

Finally, after the charge pump circuit 126 receives the phase difference signals S6 and S7, it outputs the control voltage 106 to the control terminals 104a, 128a and 130a of the voltage-control delay circuits 104, 128 and 130 according to the sum of the pulse widths of the phase difference signals S6 and S7, thereby adjusting the delay time of the voltage-control delay circuits 104, 128 and 130. The sum of the pulse widths of the phase difference signals S6 and S7 represents the time difference Δt between the voltage cross point E and the voltage cross point C, i.e. the difference between time t4 and time t2.

It should be noted that, the rising edges of the signals S1, S2, DQS and DQ have the same driving performance and the falling edges of these signals have the same driving performance. Therefore, the time difference Δt also exists between the rising edge of the data strobe signal DQS and the falling edge of the data signal DQ as shown in FIG. 6. However, the time difference Δt may affect the DQ-DQS skew, which exists when the transition edge of the data strobe signal DQS and the transition edge of the data signal DQ occurring at the same time are opposite to each other. For example, when the time difference Δt is getting longer, the DQ-DQS skew is getting larger. On the contrary, when the time difference Δt is getting shorter, the DQ-DQS skew is getting smaller. In this embodiment, the delay time of the voltage-control delay circuits 104, 128 and 130 can be respectively adjusted to one half of the time difference Δt according to the control voltage 106. In this manner, the voltage-control delay circuits 128 and 130 can delay the signal S2 by the time difference Δt while the voltage-control delay circuit 104 can delay the data strobe signal DQS by one half of the time difference Δt, i.e. (½) Δt, thereby decreasing the DQ-DQS skew, which exists when the transition edge of the data strobe signal DQS and the transition edge of the data signal DQ occurring at the same time are opposite to each other. As shown in FIG. 6, the data strobe signal DQS with one half of the time difference Δt delayed is presented by a dotted line DQS1 and the signal S2 with the time difference Δt delayed is presented by a dotted line S21.

It should be noted that, after the data strobe signal DQS is delayed by one half of the time difference Δt, the time difference Δt between the rising edge of the data strobe signal DQS and the falling edge of the data signal DQ is shortened such that the DQ-DQS skew can be minimized thereby overcoming the problem of limiting the valid time for sampling the required data. However, the data strobe signal DQS is not limited to be delayed only by one half of the time difference Δt. On the contrary, any delay time that could shorten the time difference Δt can also achieve the objective of decreasing the DQ-DQS skew.

Figure 8:
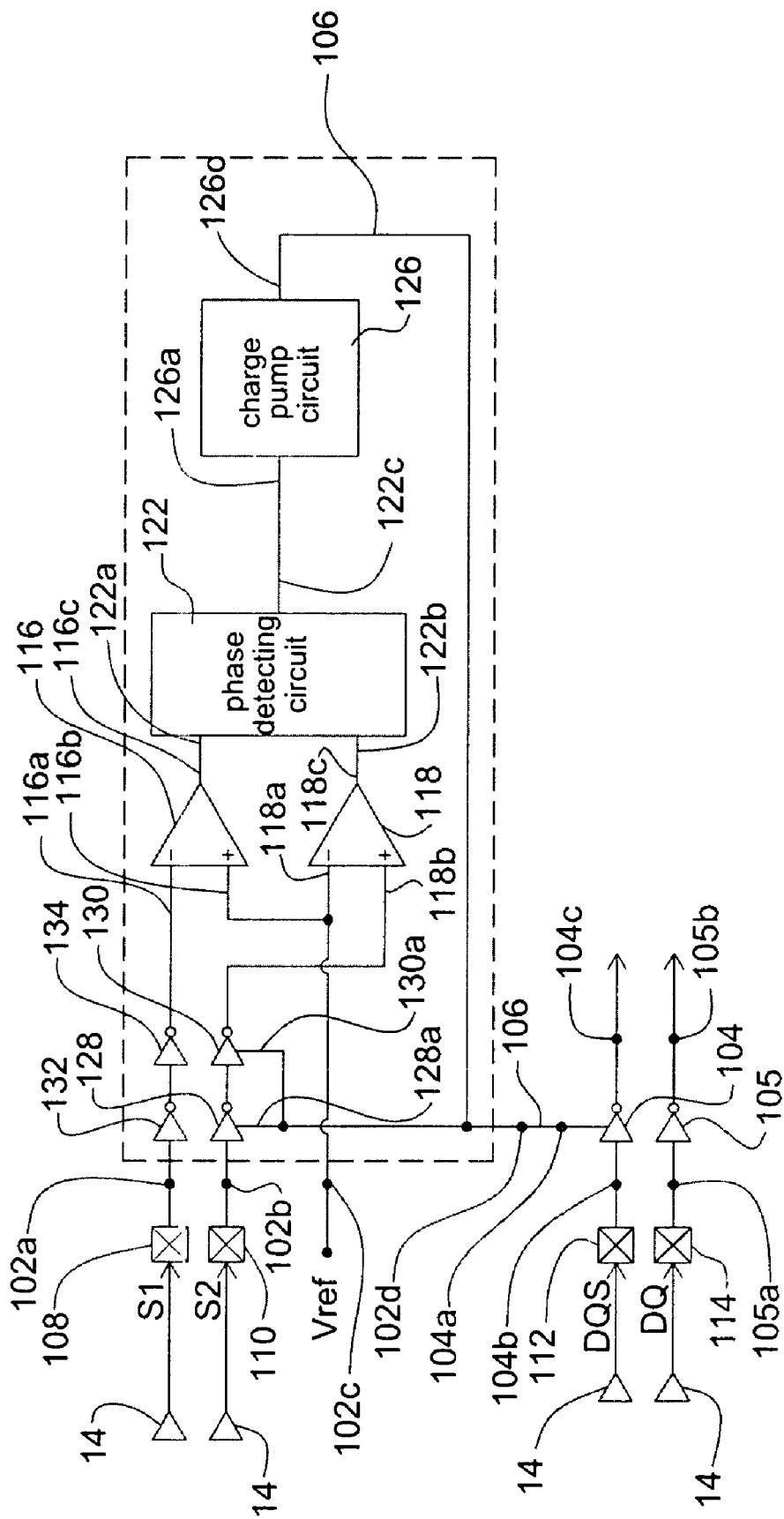
FIG. 8 shows a schematic view of a calibrating circuit according to another embodiment of the present invention.

FIG. 8 shows a circuit block of a calibrating circuit 200 for a data control signal according to another embodiment of the present invention. The elements of FIG. 8 identical to the elements of FIG. 5 are designated by the same reference numerals. The calibrating circuit 200 only has two comparators, i.e. a first comparator 116 and a second comparator 118, and a first phase detecting circuit 122 to achieve the objective of the present invention. The first comparator 116 receives the signal S1 through the input 116a and the dc reference voltage Vref through the other input 116b, and outputs the comparison signal S5, as shown in FIG. 7, through the output 116c according to the voltage levels of the signal S1 and the dc reference voltage Vref. The second comparator 118 receives the dc reference voltage Vref through the input 118a and the signal S2 through the other input 118b, and outputs the comparison signal S3, as shown in FIG. 7, through the output 118c according to the voltage levels of the dc reference voltage Vref and the signal S2. The first phase detecting circuit 122 receives the comparison signals S3 and S5 respectively, and then outputs a phase difference signal S8 to the input 126a of the charge pump circuit 126, wherein the pulse width of the phase difference signal S8 represents the time difference between the voltage cross point E and the voltage cross point C. After the charge pump circuit 126 receives the phase difference signal S8, it outputs the control voltage 106 to the control terminals 104a, 128a and 130a of the voltage-control delay circuits 104, 128 and 130 according to the pulse width of the phase difference signal S8, thereby adjusting the delay time of the voltage-control delay circuits 104, 128 and 130.

Similarly, in the calibrating circuit 200, the delay time of the voltage-control delay circuits 104, 128 and 130 can be respectively adjusted to one half of the time difference Δt according to the control voltage 106. In this manner, the voltage-control delay circuits 128 and 130 can delay the signal S2 by the time difference Δt while the voltage-control delay circuit 104 can delay the data strobe signal DQS by one half of the time difference Δt, thereby decreasing the DQ-DQS skew, which exists when the transition edge of the data strobe signal DQS and the transition edge of the data signal DQ occurring at the same time are opposite to each other.

It should be noted that, any two complementary signals can be served as signals S1 and S2 of the calibrating circuits 100 and 200. For example, when the calibrating circuits 100 and 200 are disposed within a DDR memory, the signals S1 and S2 can be two complementary clock signals CLK outputted by a DDR memory controller. In addition, when the calibrating circuits 100 and 200 are disposed within a DDR memory controller, the DDR memory controller can send a reading command to the DDR memory such that the DDR memory outputs two complementary data signals, e.g. DQ1 and DQ2, to be served as the signals S1 and S2.

Further, the calibrating circuits 100 and 200 can also be disposed within any type of dynamic random access memory (DRAM) controllers or DRAM memories and are not limited to be disposed within a DDR memory controller or a DDR memory. In addition, the data strobe signal DQS and the data signal DQ can be data control signal and data signal in other type of DRAM controller or DRAM memory and are not limited to the data strobe signal DQS and the data signal DQ under the DDR memory standard.

Although the invention has been explained in relation to its embodiment, it is not used to limit the invention. It is to be understood that many other possible modifications and variations can be made by those skilled in the art without departing from the spirit and scope of the invention as hereinafter claimed.

What is claimed is:

1. A calibrating circuit for calibrating a data control signal, comprising:
   a compensation circuit configured to receive a first signal and a second signal, the first signal having a first voltage cross point with a direct current voltage and the second signal having a second voltage cross point with the direct current voltage, wherein the compensation circuit outputs a control signal according to a time difference between the first and second voltage cross points; and
   a first delay circuit configured to receive the data control signal and delay the data control signal for a first time according to the control signal, wherein the first time is selected to reduce a skew between the data control signal and a data signal.

2. The calibrating circuit as claimed in claim 1, wherein the first signal is complementary to the second signal.

3. The calibrating circuit as claimed in claim 1, wherein the data control signal is a data strobe signal DQS under a DDR memory standard.

4. The calibrating circuit as claimed in claim 1, wherein the first time is half of the time difference.

5. The calibrating circuit as claimed in claim 1, wherein the compensation circuit further comprises:
   a first comparator configured to compare voltage levels of the first signal and the direct current voltage and output a first comparison signal according to a comparison result of comparing the voltage levels of the first signal and the direct current voltage;
   a second comparator configured to compare voltage levels of the second signal and the direct current voltage and output a second comparison signal according to a comparison result of comparing the voltage levels of the second signal and the direct current voltage;
   a phase detecting circuit configured to receive the first comparison signal and the second comparison signal and output a phase difference signal according to the phase difference between the first comparison signal and the second comparison signal; and
   a charge pump circuit configured to output the control signal according to the phase difference signal.

6. The calibrating circuit as claimed in claim 5, wherein the phase difference signal has a pulse, and the width of the pulse is a specific ratio of the time difference.

7. The calibrating circuit as claimed in claim 5, wherein the phase difference signal has a pulse, and the width of the pulse is equal to the time difference.

8. The calibrating circuit as claimed in claim 1, wherein the compensation circuit further comprises:
   a first comparator configured to compare voltage levels of the first signal and the direct current voltage and output a first comparison signal according to a comparison result of comparing the voltage levels of the first signal and the direct current voltage;
   a second comparator configured to compare voltage levels of the second signal and the direct current voltage and output a second comparison signal according to a comparison result of comparing the voltage levels of the second signal and the direct current voltage;
   a third comparator configured to compare voltage levels of the first signal and the second signal and output a third comparison signal according to a comparison result of comparing the voltage levels of the first signal and the second signal;
   a first phase detecting circuit configured to receive the first comparison signal and the third comparison signal and output a first phase difference signal according to the phase difference between the first comparison signal and the third comparison signal;
   a second phase detecting circuit configured to receive the second comparison signal and the third comparison signal and output a second phase difference signal according to the phase difference between the second comparison signal and the third comparison signal; and
   a charge pump circuit configured to output the control signal according to the first phase difference signal and second phase difference signal.

9. The calibrating circuit as claimed in claim 8, wherein the first phase difference signal has a first pulse and the second phase difference signal has a second pulse, and a sum of the widths of the first and second pulses is a specific ratio of the time difference.

10. The calibrating circuit as claimed in claim 8, wherein the first phase difference signal has a first pulse and the second phase difference signal has a second pulse, and a sum of the widths of the first and second pulses is equal to the time difference.

11. The calibrating circuit as claimed in claim 1, further comprising at least a second voltage-control delay circuit configured to receive the first signal and delay the first signal for a second time according to the control signal.

12. The calibrating circuit as claimed in claim 11, wherein the second time is equal to the time difference.

13. The calibrating circuit as claimed in claim 1, wherein one of the first signal and the second signal has a high voltage level and the other thereof has a low voltage level, and the voltage level of the direct current voltage is positioned at a middle level between the high voltage level and the low voltage level.

14. The calibrating circuit as claimed in claim 1, which is disposed within a DDR memory controller.

15. The calibrating circuit as claimed in claim 1, which is disposed within a DDR memory.

16. A calibrating method for calibrating a data control signal, comprising:
   providing a first signal, a second signal complementary to the first signal, and a direct current voltage having a first voltage cross point with the first signal and a second voltage cross point with the second signal; and
   delaying the data control signal for a first time according to a time difference between the first and second voltage cross points, wherein the first time is selected to reduce a skew between the data control signal and a data signal.

17. The calibrating method as claimed in claim 16, wherein the first time is one half of the time difference.

18. The calibrating method as claimed in claim 16, further comprising:
   delaying the first signal for a second time according to the time difference between the first and second voltage cross points.

19. The calibrating method as claimed in claim 18, wherein the second time is equal to the time difference.

20. The calibrating method as claimed in claim 16, further comprising:
   comparing voltage levels of the first signal and the direct current voltage and outputting a first comparison signal according to a comparison result of comparing the voltage levels of the first signal and the direct current voltage;
   comparing voltage levels of the second signal and the direct current voltage and outputting a second comparison signal according to a comparison result of comparing the voltage levels of the second signal and the direct current voltage; and
   determining the time difference according to the phase difference between the first comparison signal and the second comparison signal.

21. The calibrating method as claimed in claim 16, further comprising:
   comparing voltage levels of the first signal and the direct current voltage and outputting a first comparison signal according to a comparison result of comparing the voltage levels of the first signal and the direct current voltage;
   comparing voltage levels of the second signal and the direct current voltage and outputting a second comparison signal according to a comparison result of comparing the voltage levels of the second signal and the direct current voltage;
   comparing voltage levels of the first signal and the second signal and outputting a third comparison signal according to a comparison result of comparing the voltage levels of the first signal and the second signal; and
   determining the time difference according to the phase difference between the first comparison signal and the third comparison signal and the phase difference between the second comparison signal and the third comparison signal.

22. The calibrating method as claimed in claim 16, wherein the data control signal is a data strobe signal DOS under a DDR memory standard.

23. The calibrating method as claimed in claim 16, which is applied to a DDR memory controller.

24. The calibrating method as claimed in claim 16, which is applied to a DDR memory.

* * * * *